(12) United States Patent
Scheikl et al.

(10) Patent No.: US 7,528,645 B2
(45) Date of Patent: May 5, 2009

(54) TEMPERATURE DEPENDENT CLAMPING OF A TRANSISTOR

(75) Inventors: Erich Scheikl, Villach (AT); Heinz Zitta, Drobollach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 11/854,761

(22) Filed: Sep. 13, 2007

(65) Prior Publication Data

US 2009/0072887 A1    Mar. 19, 2009

(51) Int. Cl.
   *H01L 35/00* (2006.01)
(52) U.S. Cl. ........................... 327/513; 327/312
(58) Field of Classification Search ............... None
   See application file for complete search history.

(56) References Cited

U.S. PATENT DOCUMENTS

| | | | |
|---|---|---|---|
| 4,004,462 A * | 1/1977 | Dobkin | 374/173 |
| 6,087,877 A * | 7/2000 | Gonda et al. | 327/309 |
| 6,169,439 B1 * | 1/2001 | Teggatz et al. | 327/309 |
| 6,853,232 B2 * | 2/2005 | Sander et al. | 327/312 |
| 6,917,234 B2 * | 7/2005 | Horn et al. | 327/309 |
| 7,276,956 B2 * | 10/2007 | Furuta et al. | 327/534 |

* cited by examiner

*Primary Examiner*—Cassandra Cox
(74) *Attorney, Agent, or Firm*—Banner & Witcoff, Ltd.

(57) ABSTRACT

An apparatus, comprising a transistor having a source/drain node and a gate, and a circuit coupled between the source/drain node and the gate and configured to limit a voltage between the source/drain node and the gate to a clamping voltage such that the clamping voltage is reduced in response to a rising temperature of the transistor. Also, a method, comprising measuring a first temperature, measuring a second temperature, and reducing a clamped voltage between a source/drain node of a transistor and a gate of the transistor responsive to a difference between the first and second temperatures increasing.

23 Claims, 3 Drawing Sheets

TEMPERATURE DEPENDENT CLAMPING OF A TRANSISTOR

BACKGROUND

In order to switch off loads, in particular inductive loads, in a more rapid manner using integrated semiconductor power switches, use is made of a clamping circuit which limits the output voltage, that is to say the voltage drop across the load path of a power switching transistor, for example, to a maximum value $V_C$ which is below a maximum voltage (for example 60V) determined by the production technology. During the switch-off operation, a high power loss is converted in the power switching transistor, the power loss depending on the supply voltage, for example a battery voltage, and the energy stored in the inductance of the load. The so-called maximum clamping energy, that is to say that energy which can be converted in the power switching transistor without resulting in the destruction of the latter, is a parameter in the specification of power switching transistors and should be as large as possible. This clamping energy depends on the semiconductor technology used, the cooling conditions and the area of the power switching transistor. With advancing miniaturization of the components, the size of the power transistor is determined more and more often by the clamping energy and not by the on resistance.

In power switch arrangements which have been customary hitherto, the output voltage, that is to say the drain-source voltage in the case of a metal-oxide-semiconductor field-effect transistor (MOSFET), has been limited to a constant value during the turn-off operation. However, such a solution is not satisfactory with regard to the energy consumption capability of the power transistor and needs to be improved.

There is generally a need to provide an improved circuit arrangement for driving power transistors and to provide an improved turn-off method for turning off an inductive load so that the service life of the circuit arrangement is increased.

SUMMARY

Various aspects are described herein. For example, some aspects are directed to an apparatus, comprising a transistor having a source/drain node and a gate, and a circuit coupled between the source/drain node and the gate and configured to limit a voltage between the source/drain node and the gate to a clamping voltage such that the clamping voltage is reduced in response to a rising temperature of the transistor.

Still further aspects are directed to a method, comprising measuring a first temperature, measuring a second temperature, and reducing a clamped voltage between a source/drain node of a transistor and a gate of the transistor responsive to a difference between the first and second temperatures increasing.

These and other aspects will be described in more detail in connection with various illustrative embodiments.

BRIEF DESCRIPTION OF THE DRAWINGS

The following figures and the further description are intended to help to improve understanding of the invention. The elements in the figures should not necessarily be understood as a restriction, rather importance is placed on representing the principle of the invention. In the figures, identical reference symbols denote corresponding parts.

DETAILED DESCRIPTION

Figure 1:
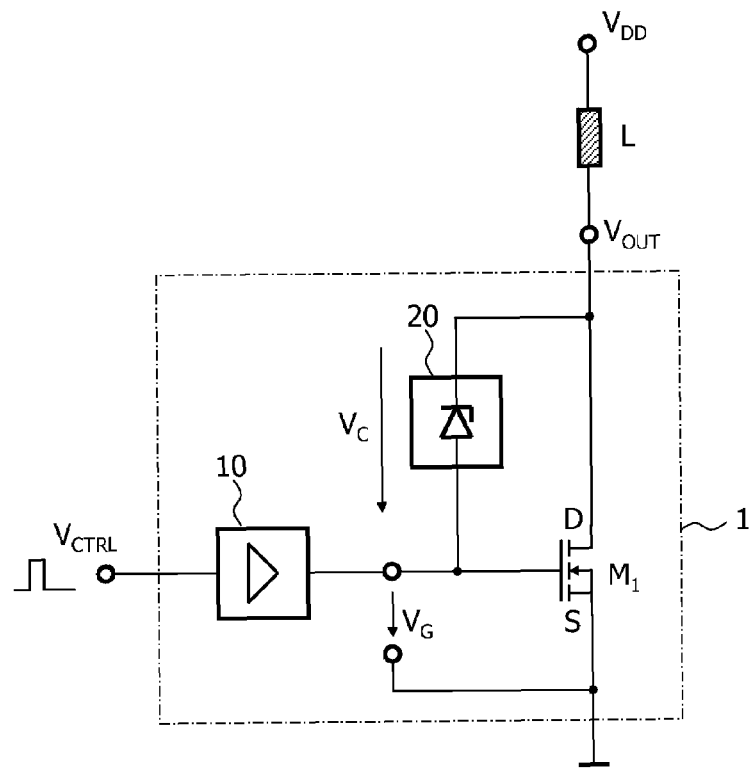
FIG. 1 shows a circuit diagram of a conventional circuit arrangement having a power transistor for switching inductive loads.

The circuit arrangement 1 illustrated in FIG. 1 has a low-side power semiconductor transistor $M_1$ in which a load path D-S of the power transistor $M_1$, which is, for example, an n-channel MOSFET in this case, is in series with a load, which is symbolized by an inductance L, in a load circuit. The load L is thus between a higher supply potential $V_{DD}$ and the load path D-S of the switching transistor $M_1$. The common circuit node between the load path D-S and the load L constitutes an output of the circuit arrangement 1. When the order of the load and circuit arrangement 1 is reversed, a circuit configuration having a high-side power switch results, the principles of the invention being able to be applied in an analogous manner to said circuit configuration. The n-channel MOSFET of the present example may likewise also be replaced with a p-channel MOSFET. The components of the circuit arrangement 1 may be integrated, for example, in a silicon semiconductor body. The circuit arrangement 1 comprises an input, which is supplied with an input signal $V_{CTRL}$, an output for connection to the load L, at which an output voltage $V_{OUT}$ is provided, and a reference potential connection which is supplied with a ground potential GND, for example.

The load L is connected to a first load connection of the transistor $M_1$, which simultaneously constitutes the output of the circuit arrangement 1. With the feed voltage $V_{DD}$, an output voltage $V_{OUT}=V_{DD}$ is dropped across the load path of the power transistor $M_1$ when the latter is turned off, that is to say open. This output voltage is based on the reference potential GND which is supplied to a second load connection of the power transistor $M_1$ in the present case.

A driver circuit 10 may be provided in order to generate a suitable driver signal $V_G$ for a control connection (gate) of the power transistor $M_1$ from an input signal $V_{CTRL}$.

The power transistor $M_1$ illustrated is a MOSFET. Its first and second load connections correspond to a drain connection and a source connection of the MOSFET, and its control connection corresponds to a gate connection.

As mentioned, a clamping circuit 20 is provided in such power switch arrangements, said clamping circuit limiting the output voltage $V_{OUT}$ to a particular constant value $V_C$—that is to say to the so-called clamping voltage—during a turn-off operation, that is to say when turning off the power transistor $M_1$. Investigations have shown that the destruction of the power transistor, in the case of excessively high energy, is brought about by a maximum permissible peak temperature of the power transistor being exceeded or by a repeated excessively large temperature swing.

Figure 2:
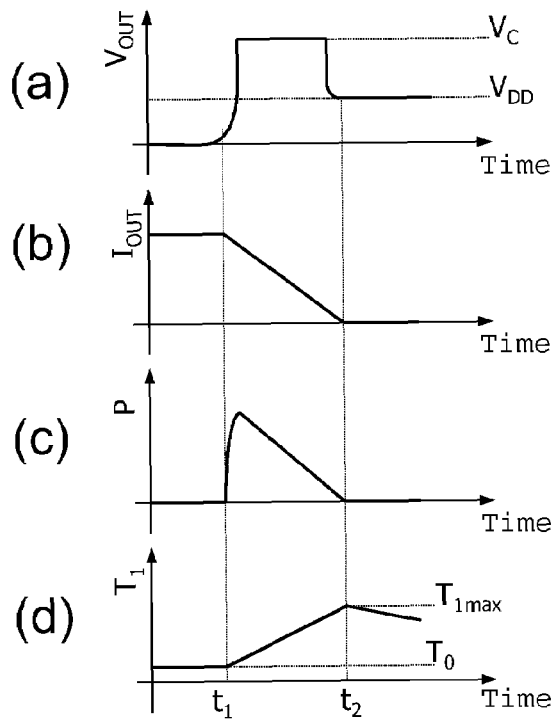
FIG. 2 is a set of timing diagrams showing relevant signal profiles when turning off the power transistor in a circuit arrangement according to FIG. 1.

The method of operation of the circuit arrangement 1 shown in FIG. 1 and the problems of local overheating as a result of the power loss released in the form of heat when turning off the power transistor $M_1$ are explained using the timing diagrams illustrated in FIG. 2. Before the time $t_1$, the power transistor $M_1$ is switched on, the output voltage, that is to say the voltage across the load path D-S of the power transistor $M_1$, is consequently equal to a saturation voltage of virtually zero (cf. FIG. 2*a*), the output current $I_{OUT}$ flowing through the load corresponds to its nominal value (cf. FIG. 2*b*), the power loss P converted in the power transistor $M_1$ is likewise virtually zero (cf. FIG. 2*c*), and the temperature $T_1$ of the power transistor $M_1$ approximately corresponds to the ambient temperature $T_0$.

The turn-off operation starts at the time $t_1$, for example by applying a suitable input voltage $V_{CTRL}$ to the driver circuit 10. The resultant fall in the output current $I_{OUT}$ (cf. FIG. 2*b*) induces a voltage in the inductive load in accordance with the law of induction, which voltage may considerably exceed the feed voltage $V_{DD}$. In order to prevent the circuit arrangement from being destroyed or damaged, the output voltage $V_{OUT}$ at the output of the circuit arrangement 1, which corresponds to the load path voltage of the transistor $M_1$, is limited to the clamping voltage $V_C$ with the aid of the clamping circuit 20.

FIG. 2*c* shows the profile of the instantaneous power loss during the turn-off operation and FIG. 2*d* shows the resultant increase in the local temperature $T_1$ of the power transistor $M_1$ relative to the ambient temperature $T_0$. At a time $t_2$, the output current $I_{OUT}$ reaches the value of a reverse current of virtually zero (cf. FIG. 2*b*) and a power loss is consequently no longer converted into heat either. The temperature $T_1$ of the power transistor can fall again from the time $t_2$. If the energy converted during a changeover operation (corresponds to the area under the curve in FIG. 2*c*) exceeds a critical value, the transistor $M_1$ may overheat. The resultant thermal stresses in a semiconductor body, in which the component structures of the circuit arrangement 1 are integrated, may be, inter alia, a cause of a reduced service life of the components of the circuit arrangement 1 which are integrated in the semiconductor body.

Figure 3:
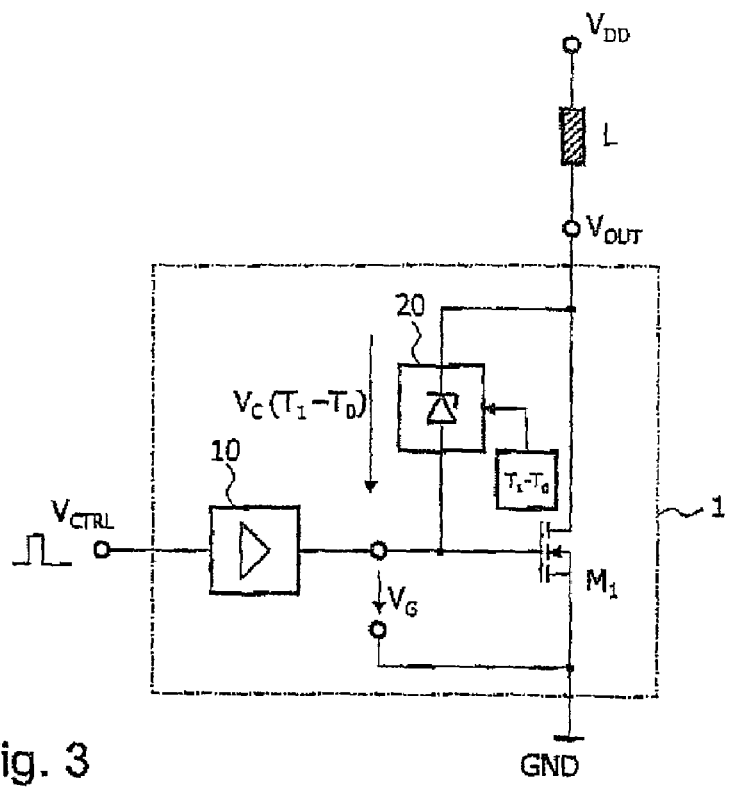
FIG. 3 shows a circuit diagram of an illustrative circuit arrangement having a power transistor for switching inductive loads, the circuit arrangement comprising a clamping circuit in which the clamping voltage is set on the basis of a temperature difference.

FIG. 3 shows, as a first example, a circuit arrangement which is modified in comparison with the circuit arrangement from FIG. 1 and is intended to switch inductive loads. The circuit arrangement in FIG. 3 essentially corresponds to the circuit arrangement in FIG. 1 but the clamping circuit 20 is designed to set the clamping voltage on the basis of a temperature difference $T_1$-$T_0$ between the local temperature $T_1$ of the power transistor $M_1$ and the ambient temperature $T_0$.

The temperature-induced stresses in the semiconductor material of the semiconductor body are dependent on the temperature difference $T_1$-$T_0$ between the local temperature $T_1$ in the power transistor $M_1$ and an ambient temperature $T_0$ which is measured, for example, in the same semiconductor body but away from the power semiconductor component. In this case, the absolute temperature plays a subordinate role in the thermally induced stresses in the semiconductor material, for which reason the temperature difference $T_1$-$T_0$ may be used to regulate the clamping voltage.

The clamping voltage $V_C$ can be adapted in stages. For example, the clamping circuit may thus be designed to reduce the clamping voltage as soon as the temperature difference $T_1$-$T_0$ exceeds a first threshold value $T_{SW1}$; that is to say as soon as the local temperature $T_1$ of the power transistor $M_1$ has increased by a first threshold value $T_{SW1}$ n comparison with the "normal temperature" of the semiconductor body in which the transistor $M_1$ is integrated. In this case, the "normal temperature" of the semiconductor body should be understood as meaning the ambient temperature $T_0$. The adaptation can be effected in any desired number of stages, and the clamping voltage can thus be respectively reduced further as soon as the temperature difference exceeds a second, a third, a fourth etc. threshold value. Alternatively, the clamping circuit 20 may also be designed to regulate the clamping voltage in a continuously variable manner on the basis of the temperature difference $T_1$-$T_0$ measured. To this end, a linear relationship between the temperature difference $T_1$-$T_0$, that is to say the greater the temperature difference $T_1$-$T_0$ the smaller the clamping voltage $V_C$, could be selected, for example. However, a relationship in which the clamping voltage $V_C$ is reduced in a relationship that is nonlinear to the rise in the temperature difference $T_1$-$T_0$ is also possible.

Figures 4A, 4B:
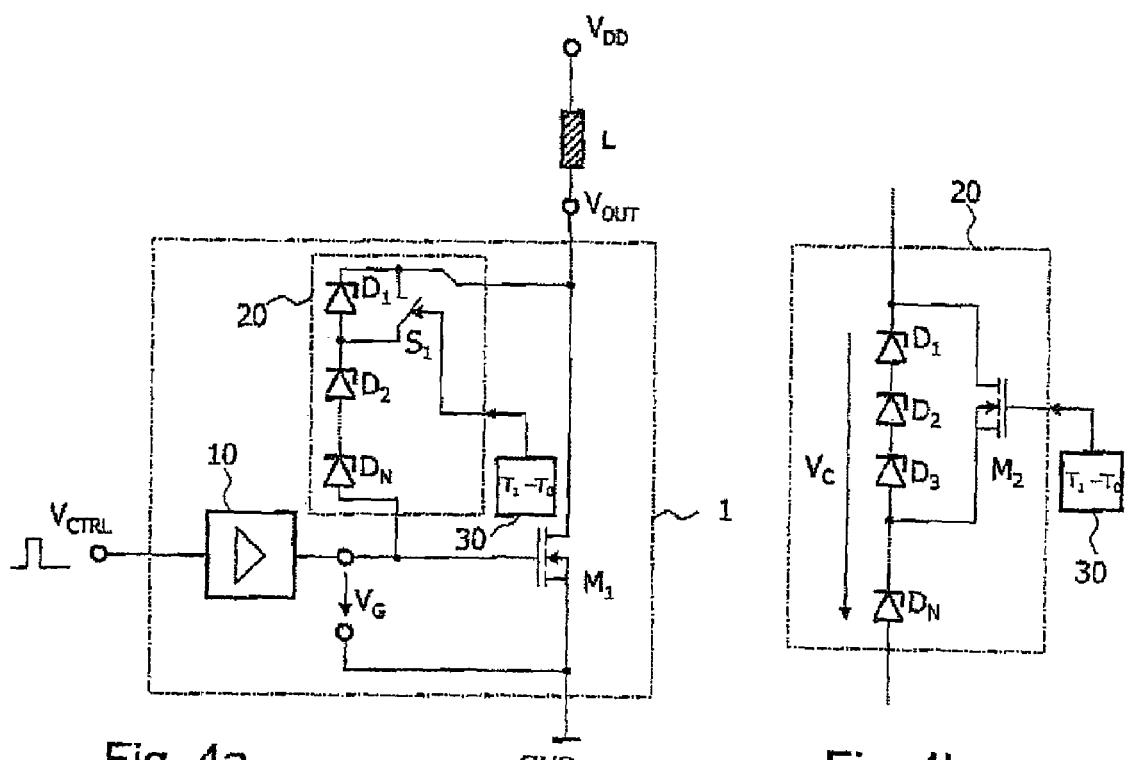
FIG. 4a shows one exemplary embodiment of the clamping circuit from FIG. 3.
FIG. 4b shows another exemplary embodiment of the clamping circuit from figure

The circuit arrangement illustrated in FIG. 4*a* corresponds to the circuit arrangement from FIG. 3, one example of a clamping circuit 20 being illustrated in more detail. In this case, the clamping circuit 20 has a chain of series-connected zener diodes D1, D2, ..., $D_N$ which are connected between the first load connection (drain) and the control connection (gate) of the transistor $M_1$. The sum of the zener voltages of the individual zener diodes D1, D2, ..., $D_N$ determines the value of the clamping voltage $V_C$.

In the case of a single-stage reduction in the clamping voltage on the basis of the temperature difference measured, a controlled switch $S_1$ is connected in parallel with at least one zener diode, so that said switch short-circuits or does not short-circuit at least one diode (for example D1) on the basis of the temperature difference $T_1$-$T_0$ measured by a temperature sensor 30 and accordingly changes the value of the clamping voltage $V_C$. For example, the clamping circuit may be designed to short-circuit at least one zener diode if the temperature difference exceeds the first threshold value $T_{SW1}$. The reduction in the clamping voltage $V_C$ achieved by short-circuiting the zener diodes may also be effected in a plurality of stages. A further zener diode may thus be respectively short-circuited when a further threshold value is exceeded.

FIG. 4*b* shows another exemplary embodiment of the clamping circuit, which is similar to the example shown in FIG. 4*a* but allows the clamping voltage $V_C$ to be varied in a continuously variable manner within a predefined range. The clamping circuit 20 from FIG. 4*b* is similar to that from FIG. 4*a* but the switch $S_1$ is a MOSFET $M_2$ connected in parallel with a number of zener diodes ($D_1$ to $D_3$ in this example). In the present case, the MOSFET $M_2$ operates as a voltage-controlled resistor. Depending on the control voltage which depends on the sensor signal from the temperature sensor 30, the resistance of the MOSFET $M_2$ can be varied from almost zero to approximately infinity. The clamping voltage $V_C$ can thus be varied as desired in the interval [$V_C$-n-$V_Z$, $V_C$], where $V_Z$ denotes the zener voltage of a zener diode and n denotes the number of zener diodes bridged by the MOSFET (n=3 in the present case).

Figure 5:
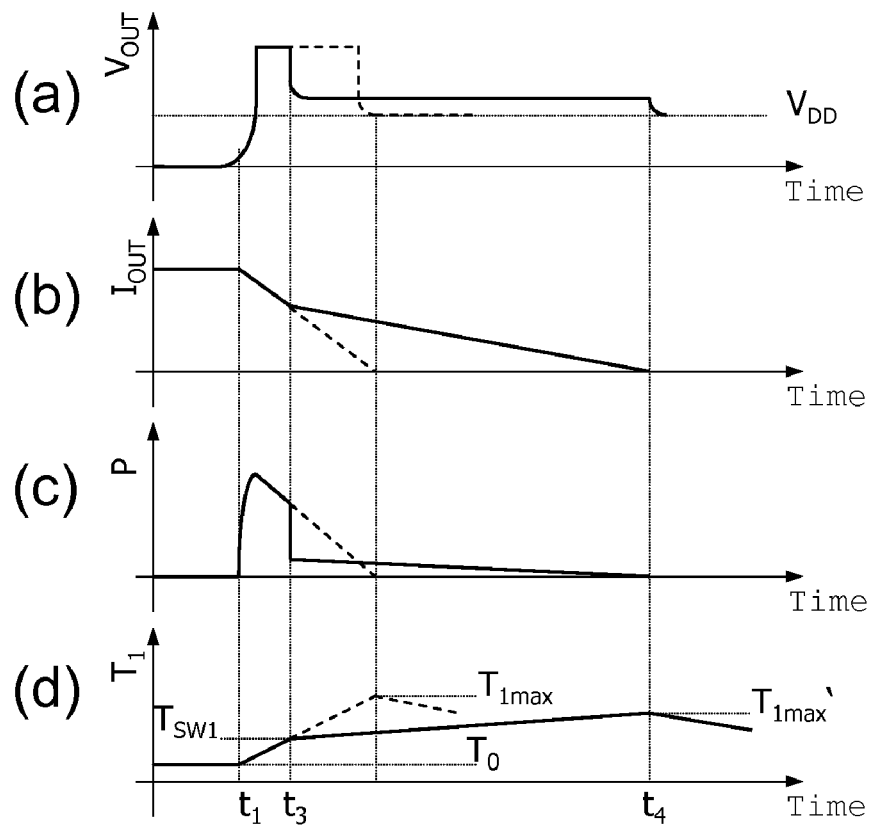
FIG. 5 is a set of timing diagrams showing relevant signal profiles when turning off the power transistor in a circuit arrangement according to FIG. 3.

FIG. 5 uses timing diagrams to show the relevant signal profiles of the circuit arrangement shown in FIG. 4*a* and illustrates the difference in the timing diagrams illustrated in FIG. 2. The signal profiles from FIG. 2 are respectively illustrated using dashed lines in order to facilitate a comparison. As already explained in the description relating to FIG. 2, before the time $t_1$, the transistor $M_1$ is switched on, the output voltage $V_{OUT}$ is virtually zero, the output current $I_{OUT}$ corresponds to its nominal value, the power loss P converted into heat is virtually zero, and the temperature of the power transistor $M_1$ essentially corresponds to the ambient temperature $T_0$. The switch-off operation begins at a time $t_1$. As already mentioned, the voltage $V_{OUT}$ induced by the inductance during the turn-off operation is limited to the value of the clamping voltage $V_C$, the clamping voltage still being formed by the sum of all zener voltages of the zener diodes D1 to $D_N$ at this point in time. The signal profiles are identical to those from FIG. 2 up until the time $t_3$. At the time $t_3$, the temperature difference $T_1-T_0$ (cf. diagram 4 of FIG. 5) exceeds a first threshold value $T_{SW1}$, which results in a zener diode being short-circuited by the switch $S_1$ and in a corresponding reduction in the clamping voltage $V_C$ by the corresponding zener voltage. As a result, the output current $I_{OUT}$ now falls more slowly and the entire switch-off operation lasts for a longer period of time. The output current $I_{OUT}$ only reaches the value of the reverse current of virtually zero at a time $t_4$ and the switch-off operation is concluded. The amount of thermal energy converted between the times $t_1$ and $t_4$ (corresponds to the area under the power curve in diagram 3 of FIG. 5) is converted over a longer period of time in comparison with the conventional circuit arrangement from FIG. 1, as a result of which the heat produced has more time to spread over the entire semiconductor body. The maximum temperature difference $T_{1max}-T_0$ achieved is consequently lower than in the example shown in FIG. 2 ($T_{max}-T_0$), as a result of which there is a lower mechanical load on the silicon semiconductor body as a result of thermally induced stresses.

Figure 6:
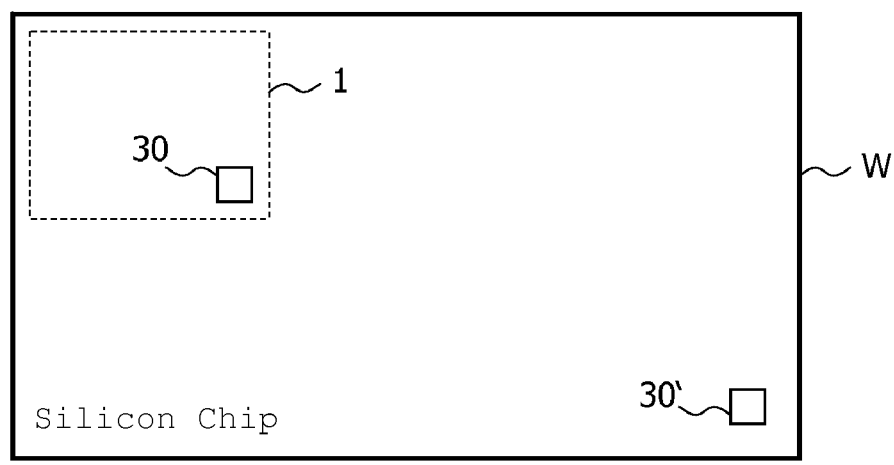
FIG. 6 shows an illustrative position of the temperature sensors on a silicon chip.

FIG. 6 shows, by way of example, an arrangement of the temperature sensor 30 in a silicon semiconductor body W. In this case, the temperature sensor 30 should be arranged in the immediate vicinity of the power transistor $M_1$. In order to be able to measure the relevant temperature difference $T_1-T_0$ as well as possible, a further temperature sensor 30' may be integrated, for example, in the same semiconductor body W away from the power transistor $M_1$. The temperature measured by the temperature sensor 30' is then used as the ambient temperature. In this case, the temperature sensor 30 requires a differential amplifier in order to determine the relevant temperature difference $T_1-T_0$. Alternatively, a single temperature sensor 30 in the immediate vicinity of the semiconductor transistor $M_1$ may suffice if the ambient temperature is measured when starting up the circuit arrangement and is stored in the temperature sensor 30. The relevant temperature difference is then respectively determined by measuring the absolute temperature $T_1$ of the power transistor $M_1$, from which the stored ambient temperature $T_0$ is then subtracted. In both cases, however, the clamping voltage is adapted on the basis of the temperature difference $T_1-T_0$ between the local temperature of the power transistor $M_1$ and the ambient temperature $T_0$.

Reducing the clamping voltage in stages on the basis of the temperature difference makes it possible to already intervene at an early point in time and at a relatively moderate temperature and to prevent unnecessary heating of the switching transistor $M_1$, thus increasing the robustness and thus the service life of the circuit arrangement. Heating to such high values which would result in the transistor $M_1$ being immediately destroyed or damaged is largely prevented.

Although examples of the present invention have been described in detail, it should be emphasized that these examples are used to describe the present invention and should not necessarily be understood as restricting the invention. Many modifications and variations to the described examples, which are nevertheless in the spirit of the invention, may be effected by a person skilled in the art.

The invention claimed is:

1. An apparatus, comprising:
   a transistor having a source/drain node and a gate; and
   a circuit coupled between the source/drain node and the gate and configured to limit a voltage between the source/drain node and the gate to a clamping voltage such that the clamping voltage is reduced in response to a rising temperature of the transistor,
   wherein the circuit comprises a first temperature sensor disposed so as to sense a temperature associated with the temperature of the transistor, and
   wherein the circuit further comprises a second temperature sensor disposed further away from the transistor than the first temperature sensor, wherein the circuit is configured to reduce the clamping voltage in response to a rise of the temperature measured by the first temperature sensor relative to a temperature measured by the second temperature sensor.

2. The apparatus of claim 1, wherein the circuit is configured to reduce the clamping voltage responsive to a difference between the temperature measured by the first temperature sensor and the temperature measured by the second temperature sensor exceeding a first threshold value.

3. The apparatus of claim 2, wherein the circuit is configured to further reduce the clamping voltage responsive to the difference between the temperature measured by the first temperature sensor and the temperature measured by the second temperature sensor exceeding a second threshold value higher than the first threshold value.

4. The apparatus of claim 1, wherein the circuit is configured to adjust the clamping voltage in a continuously variable manner based on the difference between the temperature measured by the first temperature sensor and the temperature measured by the second temperature sensor.

5. The apparatus of claim 1, wherein the circuit is further configured to adjust the clamping voltage based on a difference between the temperature measured by the first temperature sensor at a first time and the temperature measured by the first temperature sensor at a second time.

6. The apparatus of claim 1, wherein the circuit comprises a first zener diode in series with a second zener diode, and is further configured to selectively short-circuit the first zener diode depending upon the temperature of the transistor.

7. The apparatus of claim 6, wherein the circuit is further configured to selectively short-circuit the second zener diode depending upon the temperature of the transistor.

8. The apparatus of claim 1, wherein the circuit comprises:
   a plurality of zener diodes in series with each other;
   a temperature sensor configured to measure a difference between two temperatures; and
   a variable resistance in parallel with the plurality of zener diodes, wherein the variable resistance is configured to reduce in resistance with an increase in the difference between the two temperatures.

9. A method, comprising:
   measuring a first temperature;
   measuring a second temperature; and
   reducing a clamped voltage between a source/drain node of a transistor and a gate of the transistor responsive to a difference between the first and second temperatures increasing.

10. The method of claim 9, wherein the measuring the first temperature comprises measuring the first temperature at a first location, and measuring the second temperature comprises measuring the second temperature at a second location, and the second location is at a greater distance from the transistor than the first location.

11. The method of claim 9, wherein measuring the first temperature comprises measuring the first temperature at a location at a first time, and measuring the second temperature comprises measuring the second temperature at the same location at a second time.

12. The method of claim 9, wherein reducing comprises reducing the clamped voltage in response to the difference exceeding a first threshold value.

13. The apparatus of claim 12, wherein reducing comprises further reducing the clamped voltage in response to the difference exceeding a second threshold value higher than the first threshold value.

14. An apparatus, comprising:
a transistor having a source/drain node and a gate;
a first sensor configured to measure a temperature that depends on a temperature of the transistor;
a second sensor configured to measure an ambient temperature; and
a circuit coupled between the source/drain node and the gate and configured to limit a voltage between the source/drain node and the gate to a clamping voltage that depends upon a difference between the temperature measured by the first sensor and the temperature measured by the second sensor.

15. The apparatus of claim 14, wherein the circuit is configured to lower the clamping voltage in response to the difference increasing.

16. The apparatus of claim 14, wherein the circuit is configured to raise the clamping voltage in response to the difference decreasing.

17. The apparatus of claim 14, wherein the circuit is configured to compare the difference with a threshold value, and to lower the clamping voltage in response to the difference exceeding the threshold value.

18. The apparatus of claim 14, wherein the circuit comprises:
a first diode;
a second diode in series with the first diode; and
a switch configured to selectively short circuit the first diode based upon the difference.

19. The apparatus of claim 14, wherein the circuit comprises:
a diode;
a variable resistance coupled in parallel with the diode and configured to change resistance based upon the difference.

20. An apparatus, comprising a circuit having a first node and a second node and configured to force a voltage between the first and second notes nodes to a clamping voltage that depends upon a difference between a first measured temperature and a second measured temperature, such that the clamping voltage is decreased in response to an increase in the difference.

21. The apparatus of claim 20, further comprising a transistor having a source/drain node coupled to the first node and a gate coupled to the second node.

22. The apparatus of claim 20, further comprising:
a first sensor configured to measure the first measured temperature at a first location; and
a second sensor configured to measure the second measured temperature at a second location.

23. The apparatus of claim 20, further comprising a sensor configured to measure the first measured temperature at a first time and the second measured temperature at a second time.

* * * * *